United States Patent
Wang et al.

(10) Patent No.: US 11,275,120 B2
(45) Date of Patent: Mar. 15, 2022

(54) BATTERY MONITORING DEVICE

(71) Applicant: Yazaki Corporation, Tokyo (JP)

(72) Inventors: Jian Wang, Shizuoka (JP); Hironao Fujii, Shizuoka (JP); Saki Oonishi, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 17/222,921

(22) Filed: Apr. 5, 2021

(65) Prior Publication Data
US 2021/0318387 A1 Oct. 14, 2021

(30) Foreign Application Priority Data
Apr. 9, 2020 (JP) .............................. JP2020-070155

(51) Int. Cl.
*G01R 31/3842* (2019.01)
*G01R 31/396* (2019.01)
*G01R 31/367* (2019.01)

(52) U.S. Cl.
CPC ....... *G01R 31/3842* (2019.01); *G01R 31/367* (2019.01); *G01R 31/396* (2019.01)

(58) Field of Classification Search
CPC G01R 31/3842; G01R 31/367; G01R 31/396; G01R 31/392; G01R 31/389
See application file for complete search history.

(56) References Cited

U.S. PATENT DOCUMENTS

| | | | |
|---|---|---|---|
| 10,627,450 B2* | 4/2020 | Fujii | G01R 31/392 |
| 10,637,267 B2* | 4/2020 | Syouda | G01R 31/392 |
| 2017/0052230 A1* | 2/2017 | Syouda | G01R 31/389 |
| 2018/0210032 A1* | 7/2018 | Fujii | G01R 31/389 |
| 2018/0212279 A1 | 7/2018 | Wang et al. | |

FOREIGN PATENT DOCUMENTS

| | | | | |
|---|---|---|---|---|
| JP | 2015014563 A | * | 1/2015 | |
| JP | 2018-116012 A | | 7/2018 | |
| WO | WO-2013161067 A1 | * | 10/2013 | ......... G01R 31/3835 |
| WO | WO-2021135565 A1 | * | 7/2021 | ............ H01M 10/46 |

* cited by examiner

*Primary Examiner* — Natalie Huls
*Assistant Examiner* — Michael J Singletary
(74) *Attorney, Agent, or Firm* — Kenealy Vaidya LLP (57) ABSTRACT

In a battery monitoring device, an amplifier circuit outputs an amplified differential voltage value obtained by amplifying a differential voltage value between a first voltage value of a battery and a reference voltage value, and outputs an amplified differential voltage value obtained by amplifying a differential voltage value between a second voltage value of the battery and the reference voltage value. A CPU calculates an internal resistance value of the battery based on the amplified differential voltage value outputted from the amplifier circuit, the amplified differential voltage value outputted from the amplifier circuit, a current value of a constant current adjusted by a constant current circuit, and a current value of a constant current adjusted by the constant current circuit. The reference voltage value is a voltage value between the first voltage value and the second voltage value.

4 Claims, 4 Drawing Sheets

BATTERY MONITORING DEVICE

CROSS-REFERENCE TO RELATED APPLICATION(S)

The present application claims priority to and incorporates by reference the entire contents of Japanese Patent Application No. 2020-070155 filed in Japan on Apr. 9, 2020.

BACKGROUND OF THE INVENTION

1. Field of the Invention

The present invention relates to a battery monitoring device.

2. Description of the Related Art

For example, there has been a battery monitoring device which includes an amplifier circuit for amplifying a differential voltage value between a voltage value of a battery and a predetermined reference voltage value, and a detection unit for detecting an internal resistance value of the battery based on the differential voltage value amplified by the amplifier circuit and a current value of the battery. Japanese Patent Application Laid-open No. 2018-116012 describes a differential voltage measuring device for detecting an internal resistance value of a battery based on a voltage obtained by amplifying a differential voltage between a first voltage and a second voltage of the battery.

In the conventional battery monitoring device, for example, the voltage value which can be detected by a detection unit is limited, and therefore, the differential voltage value after amplification must be set to be less than or equal to the maximum voltage value which can be detected by the detection unit. Since the differential voltage value before amplification is large in the conventional battery monitoring device, it is necessary to reduce the amplification factor in order to make the differential voltage value after amplification less than or equal to the maximum voltage value, and thus, the detection accuracy of the internal resistance value of the battery may be lowered.

SUMMARY OF THE INVENTION

In view of the foregoing, it is an object of the present invention to provide a battery monitoring device capable of improving the detection accuracy of the internal resistance value of a battery.

In order to achieve the above mentioned object, a battery monitoring device according to one aspect of the present invention includes a battery monitoring circuit including a battery to be monitored; a constant current circuit that is provided in the battery monitoring circuit and adjusts a current of the battery flowing in the battery monitoring circuit to a constant current of a first current value and a constant current of a second current value which is a current value different from the first current value; an amplifier circuit that outputs a first amplified differential voltage value obtained by amplifying a differential voltage value between a first voltage value of the battery and a predetermined reference voltage value when the constant current of the first current value adjusted by the constant current circuit flows in the battery monitoring circuit, and outputs a second amplified differential voltage value obtained by amplifying a differential voltage value between a second voltage value of the battery and the reference voltage value when the constant current of the second current value adjusted by the constant current circuit flows in the battery monitoring circuit; and a controller that calculates an internal resistance value of the battery based on the first amplified differential voltage value outputted by the amplifier circuit, the second amplified differential voltage value outputted by the amplifier circuit, the first current value of the constant current adjusted by the constant current circuit, and the second current value of the constant current adjusted by the constant current circuit, wherein the reference voltage value is a voltage value between the first voltage value and the second voltage value.

According to another aspect of the present invention, in the battery monitoring device, it is preferable that the reference voltage value is a central voltage value between the first voltage value and the second voltage value.

According to still another aspect of the present invention, in the battery monitoring device, it is preferable that the reference voltage value is a voltage value corresponding to the number of years in use of the battery and temperature change of the battery.

The above and other objects, features, advantages and technical and industrial significance of this invention will be better and by reading the following detailed description or presently preferred embodiments of the invention, when considered in connection with the accompanying drawings.

DETAILED DESCRIPTION OF THE PREFERRED EMBODIMENTS

A mode (embodiment) for carrying out the present invention will be described in detail with reference to the drawings. The present invention is not limited by the contents described in the following embodiments. Further, the components described below include those which can be easily assumed by those skilled in the art, and those which are substantially the same. Further, the configurations described below can be combined as appropriate. In addition, various omissions, substitutions, or changes of the configuration can be made without departing from the gist of the present invention.

Embodiments

Figure 1:
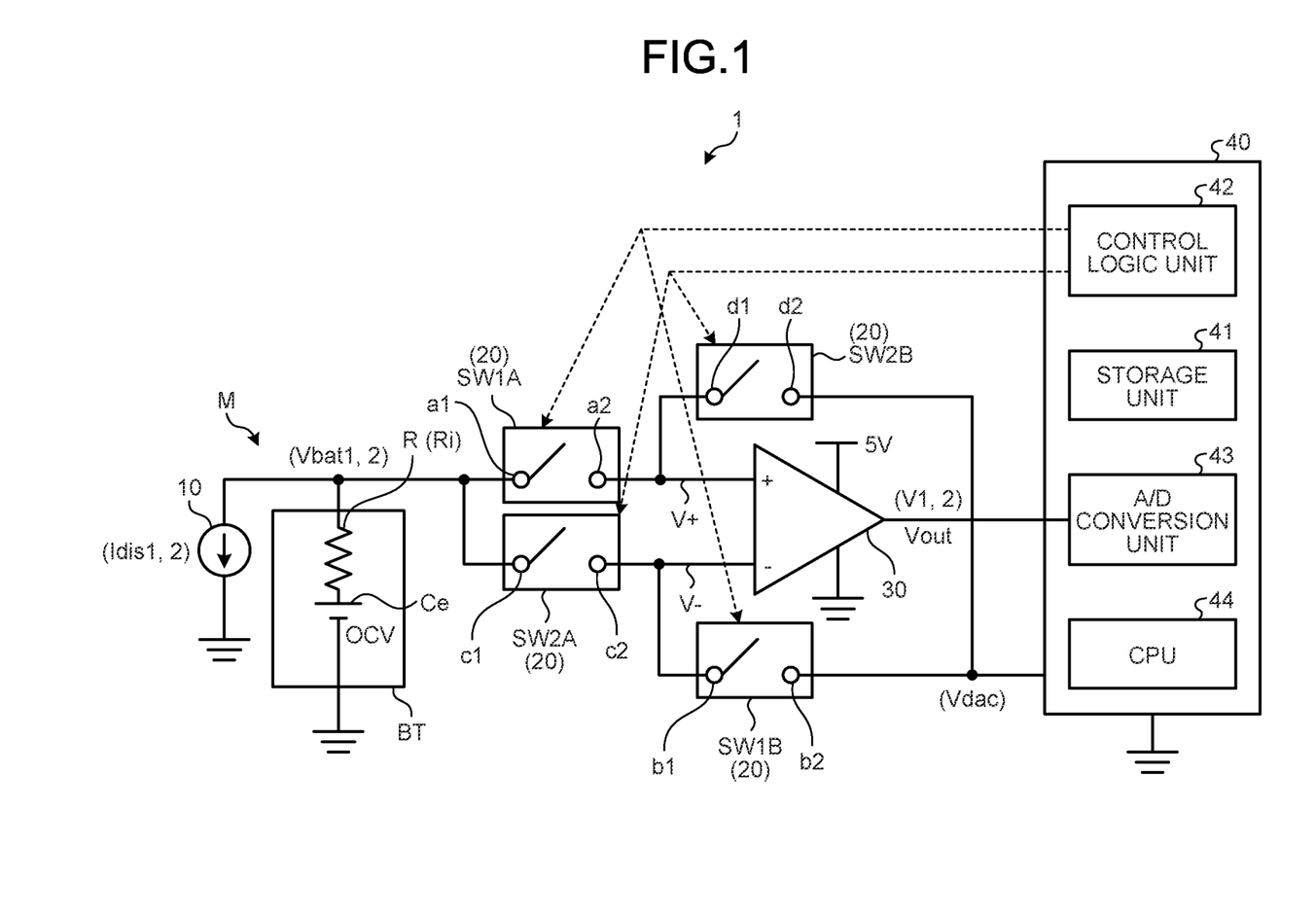
FIG. 1 is a circuit diagram illustrating a configuration example of a battery monitoring device according to an embodiment.
Figure 2:
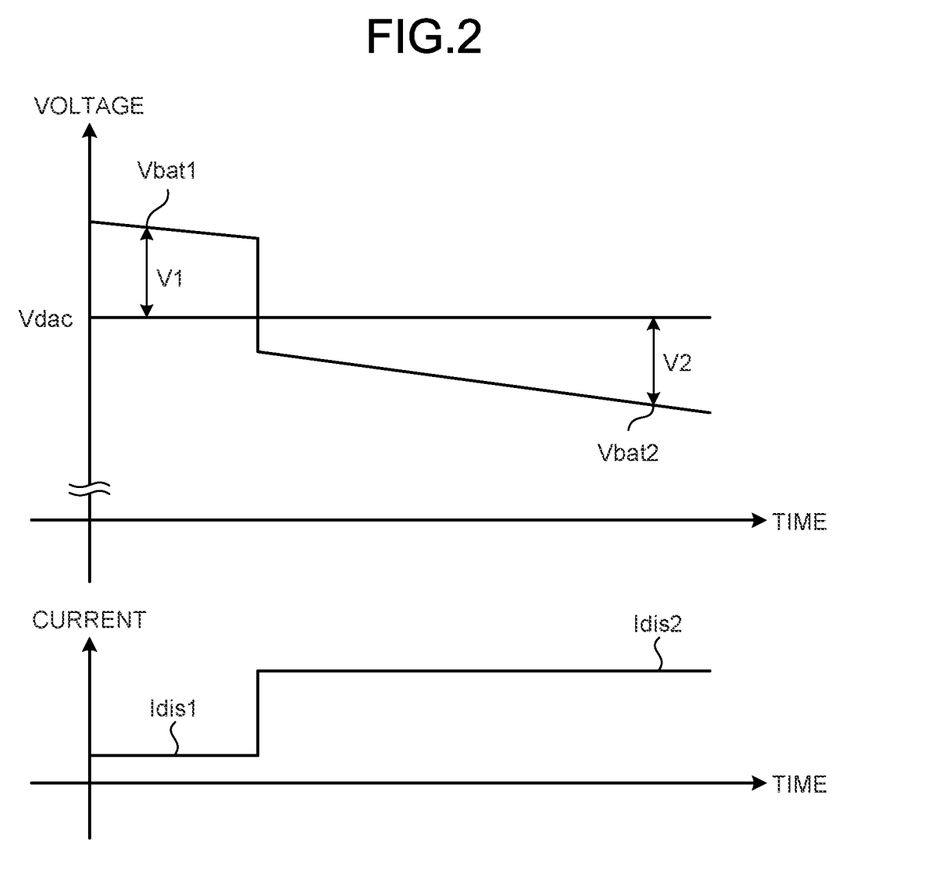
FIG. 2 is a diagram illustrating a differential voltage value between a voltage value of a battery and a reference voltage value according to the embodiment.

A battery monitoring device 1 according to an embodiment of the present invention will be described with reference to the drawings. FIG. 1 is a circuit diagram illustrating a configuration example of the battery monitoring device 1 according to the embodiment. FIG. 2 is a diagram illustrating a differential voltage value between voltage values $V_{bat1}$ and $V_{bat2}$ of a battery BT and a reference voltage value $V_{dac}$ according to the embodiment. Although FIG. 2 illustrates the discharge current, the same tendency can be obtained only by changing the voltage drop to the voltage rise even in the case of the charge current. The battery monitoring device 1 is mounted on a vehicle, calculates an internal resistance value Ri of an internal resistance R of the battery BT of the vehicle, and estimates deterioration (state of health; SOH) of the battery BT based on the internal resistance value Ri. The battery monitoring device 1 will be described below in detail.

The battery monitoring device 1 includes a battery monitoring circuit M, the battery BT as a battery, a constant current circuit 10, a switch circuit 20, an amplifier circuit 30, and a micro controller unit (MCU) 40.

The battery monitoring circuit M includes a battery BT to be monitored, and is a circuit for calculating the internal resistance value Ri of the battery BT. In other words, the battery monitoring circuit M is a circuit for detecting a difference in cell voltage due to a change in the charge/discharge current of the battery BT.

The battery BT is a battery capable of charging and discharging DC power, for example, a lithium-ion battery. The battery BT includes one or a plurality of battery cells Ce. The battery BT includes an internal resistance R due to aging degradation corresponding to the use of the battery BT. The battery BT supplies power to a load unit (not illustrated) mounted on the vehicle by a power supply circuit different from the above-described battery monitoring circuit M.

The constant current circuit 10 is provided in the battery monitoring circuit M and adjusts the current flowing in the battery monitoring circuit M to a constant current. One end of the constant current circuit 10 is connected to the positive electrode of the battery BT, and the other end of thereof is connected to the ground. The constant current circuit 10 adjusts the current of the battery BT flowing in the battery monitoring circuit M to constant currents of predetermined current values Idis1 and Idis2. When calculating the internal resistance value Ri of the battery BT, the constant current circuit 10 first supplies a constant current to the battery monitoring circuit M at the current value Idis1, and then supplies a constant current to the battery monitoring circuit M at the current value Idis2 different from the current value Idis1 (greater than the current value Idis1).

The switch circuit 20 includes switches SW1A, SW1B, SW2A, and SW2B. These switches SW1A to SW2B switch an electrical connection between a first contact and a second contact. When the switches SW1A to SW2B are turned on, the first contact and the second contact are electrically connected, and when the switches SW1A to SW2B are turned off, the first contact and the second contact are disconnected. The switches SW1A to SW2B are turned on or off based on a switching signal outputted from the MCU 40.

The switch SW1A is provided between the battery BT and the amplifier circuit 30. In the switch SW1A, a first contact a1 is connected to the positive electrode of the battery BT, and a second contact a2 is connected to the input terminal (non-inverting input terminal) V+ of the amplifier circuit 30. When the switch SW1A is turned on, the positive electrode of the battery BT and the input terminal V+ of the amplifier circuit 30 are electrically connected, and when the switch SW1A is turned off, the positive electrode of the battery BT and the input terminal V+ of the amplifier circuit 30 are disconnected.

The switch SW1B is provided between the amplifier circuit 30 and the MCU 40. In the switch SW1B, a first contact b1 is connected to the input terminal (inverting input terminal) V− of the amplifier circuit 30, and a second contact b2 is connected to the MCU 40. When the switch SW1B is turned on, the input terminal V− of the amplifier circuit 30 and the MCU 40 are electrically connected, and when the switch SW1B is turned off, the input terminal V− of the amplifier circuit 30 and the MCU 40 are disconnected.

The switch SW2A is provided between the battery BT and the amplifier circuit 30. In the switch SW2A, a first contact c1 is connected to the positive electrode of the battery BT, and a second contact c2 is connected to the input terminal V− of the amplifier circuit 30. When the switch SW2A is turned on, the positive electrode of the battery BT and the input terminal V− of the amplifier circuit 30 are electrically connected, and when the switch SW2A is turned off, the positive electrode of the battery BT and the input terminal V− of the amplifier circuit 30 are disconnected.

The switch SW2B is provided between the amplifier circuit 30 and the MCU 40. In the switch SW2B, a first contact d1 is connected to the input terminal V+ of the amplifier circuit 30, and a second contact d2 is connected to the MCU 40. When the switch SW2B is turned on, the input terminal V+ of the amplifier circuit 30 and the MCU 40 are electrically connected, and when the switch SW2B is turned off, the input terminal V+ of the amplifier circuit 30 and the MCU 40 are disconnected.

The amplifier circuit 30 is a differential amplifier circuit for amplifying a differential voltage and is operated by a single power supply (5 V). The amplifier circuit 30 includes an input terminal V+, an input terminal V−, and an output terminal Vout. The input terminal V+ is connected to the positive electrode of the battery BT via the switch SW1A, and inputs the voltage value Vbat1 of the battery BT. The voltage value Vbat1 of the battery BT is the voltage value of the battery BT when the constant current circuit 10 adjusts the current value Idis1 to a constant current. Further, the input terminal V+ is connected to the MCU 40 via the switch SW2B, and inputs the reference voltage value Vdac from the MCU 40. As illustrated in FIG. 2, the reference voltage value Vdac is a voltage between the voltage value Vbat1 of the battery BT when the constant current of the current value Idis1 adjusted by the constant current circuit 10 flows through the battery monitoring circuit M and the voltage value Vbat2 of the battery BT when the constant current of the current value Idis2 different from the current value Idis1 adjusted by the constant current circuit 10 flows through the battery monitoring circuit M. The reference voltage value Vdac is, for example, a central voltage value between the voltage value Vbat1 and the voltage value Vbat2.

The input terminal V− is connected to the positive electrode of the battery BT via the switch SW2A, and inputs the voltage value Vbat2 of the battery BT. The voltage value Vbat2 of the battery BT is the voltage value of the battery BT when the constant current circuit 10 adjusts the current value Idis2 different from the current value Idis1 to a constant current. Further, the input terminal V− is connected to the MCU 40 via the switch SW1B, and inputs the reference voltage value Vdac from the MCU 40.

The output terminal Vout is connected to the MCU 40 and outputs the amplified differential voltage to the MCU 40.

The amplifier circuit 30 amplifies a differential voltage (voltage value Vbat1−reference voltage value Vdac) between the voltage value Vbat1 of the battery BT inputted from the input terminal V+ and the reference voltage value Vdac inputted from the input terminal V−, and outputs the amplified differential voltage value V1 from the output terminal Vout to the MCU 40. Further, the amplifier circuit 30 amplifies a differential voltage (reference voltage value Vdac−voltage value Vbat2) between the reference voltage value Vdac inputted from the input terminal V+ and the voltage value Vbat2 of the battery BT inputted from the input terminal V−, and outputs the amplified differential voltage value V2 to the MCU 40.

The MCU 40 controls the switch circuit 20 and calculates the internal resistance value Ri of the battery BT. The MCU 40 includes a storage unit 41, a control logic unit 42, an A/D conversion unit 43, and a CPU 44 serving as a controller, and these functions are mounted on one integrated circuit (IC).

The storage unit 41 is a nonvolatile memory for storing various kinds of information. The storage unit 41 stores, for example, conditions, information, various programs, and applications necessary for various processes performed by, for example, the control logic unit 42 and the CPU 44. The storage unit 41 also stores the reference voltage value Vdac. In the storage unit 41, these pieces of information are read out or various kinds of information are written as necessary, by, for example, the control logic unit 42 and the CPU 44.

The control logic unit 42 controls the switch circuit 20. The control logic unit 42 is connected to the switch circuit 20 and outputs a switching signal for turning the switch circuit 20 on or off to the switch circuit 20. For example, the control logic unit 42 outputs a switching signal to the switch circuit 20, turns on the switches SW1A and SW1B, turns off the switches SW2A and SW2B, inputs the voltage value Vbat1 of the battery BT to the input terminal V+ of the amplifier circuit 30, and inputs the reference voltage value Vdac to the input terminal V− of the amplifier circuit 30. Further, the control logic unit 42 outputs a switching signal to the switch circuit 20, turns on the switches SW2A and SW2B, turns off the switches SW1A and SW1B, inputs the reference voltage value Vdac to the input terminal V+ of the amplifier circuit 30, and inputs the voltage value Vbat2 of the battery BT to the input terminal V− of the amplifier circuit 30.

The A/D conversion unit 43 converts an analog signal into a digital signal. The A/D conversion unit 43 is connected to the output terminal Vout of the amplifier circuit 30, and converts the analog signal outputted from the output terminal Vout into a digital signal. The A/D conversion unit 43 converts, for example, the amplified differential voltage values V1 and V2 of the analog signal outputted from the output terminal Vout into the amplified differential voltage values V1 and V2 of the digital signal. The A/D conversion unit 43 outputs the amplified differential voltage values V1 and V2 of the converted digital signal to the CPU 44.

The CPU 44 calculates the internal resistance value Ri of the battery BT, for example. When the CPU 44 calculates the internal resistance value Ri of the battery BT, the CPU refers to the storage unit 41 and outputs the reference voltage value Vdac stored in the storage unit 41 to the amplifier circuit 30. The CPU 44 then calculates the internal resistance value Ri of the battery BT based on the amplified differential voltage values V1 and V2 outputted from the A/D conversion unit 43 and the current values Idis1 and Idis2 of constant currents adjusted by the constant current circuit 10. The CPU 44 calculates, for example, the internal resistance value Ri of the battery BT by dividing a value obtained by adding the amplified differential voltage value V1 and the amplified differential voltage value V2 by a value obtained by subtracting the current value Idis1 from the current value Idis2. In other words, the CPU 44 calculates the internal resistance value Ri according to the following expression (1).

$$Ri=(V1+V2)/(Idis2-Idis1) \quad (1)$$

As a method for obtaining the current values Idis1 and Idis2, the CPU 44 may obtain the current values Idis1 and Idis2 from the constant current circuit 10 or may obtain the current values by reading the current values Idis1 and Idis2 previously stored in the storage unit 41.

A method for determining the reference voltage value Vdac will now be described. The reference voltage value Vdac is a voltage value corresponding to the number of years in use of the battery BT and the temperature change of the battery BT. For example, the minimum internal resistance value Ri of the battery BT is obtained by calculating when the battery BT is in its initial state and the operating temperature is the highest. The maximum internal resistance value Ri of the battery BT is obtained by calculating when the battery BT reaches the maximum number of years in use and the operating temperature is the lowest. The minimum internal resistance value Ri and the maximum internal resistance value Ri may be calculated by computer simulation or may be calculated based on a detection result obtained from an actual battery BT.

The present embodiment then calculates a range of "voltage value Vbat1−voltage value Vbat2" from the minimum internal resistance value Ri and the maximum internal resistance value Ri. "voltage value Vbat1−voltage value Vbat2" is calculated by the following expression (2). In the expression (2), Vbat1 and Vbat2 represent voltage values, Ri represents internal resistance values, and Idis1 and Idis2 represent current values.

$$Vbat1-Vbat2=Ri \times (Idis2-Idis1) \quad (2)$$

In the expression (2), as described above, the internal resistance value Ri ranges from the minimum internal resistance value Ri to the maximum internal resistance value Ri corresponding to the number of years in use and temperature changes of the battery BT. Thus, "Vbat1−Vbat2" also has a voltage value range corresponding to the range of the internal resistance value Ri. The range of "Vbat1−Vbat2" is calculated by the expression (2).

The reference voltage value Vdac is calculated by the following expression (3). In the expression (3), Vdac represents a reference voltage value, and Vbat1 and Vbat2 represent voltage values. "Vbat1−Vbat2" is a voltage value calculated by the above expression (2).

$$Vdac=Vbat2+(Vbat1-Vbat2)/2 \quad (3)$$

In the expression (3), "Vbat1−Vbat2" has a voltage value range corresponding to the range of the internal resistance value Ri, as described above. Thus, the reference voltage value Vdac also has a range of voltage values corresponding to the range of "Vbat1−Vbat2". The range of the reference voltage value Vdac is calculated by the expression (3). In the range of the reference voltage value Vdac, the central voltage value is set as the reference voltage value Vdac. Thus, the reference voltage value Vdac becomes a voltage value adapted to the number of years in use and the temperature change of the battery BT. The reference voltage value Vdac is stored in the storage unit 41.

Figure 3:
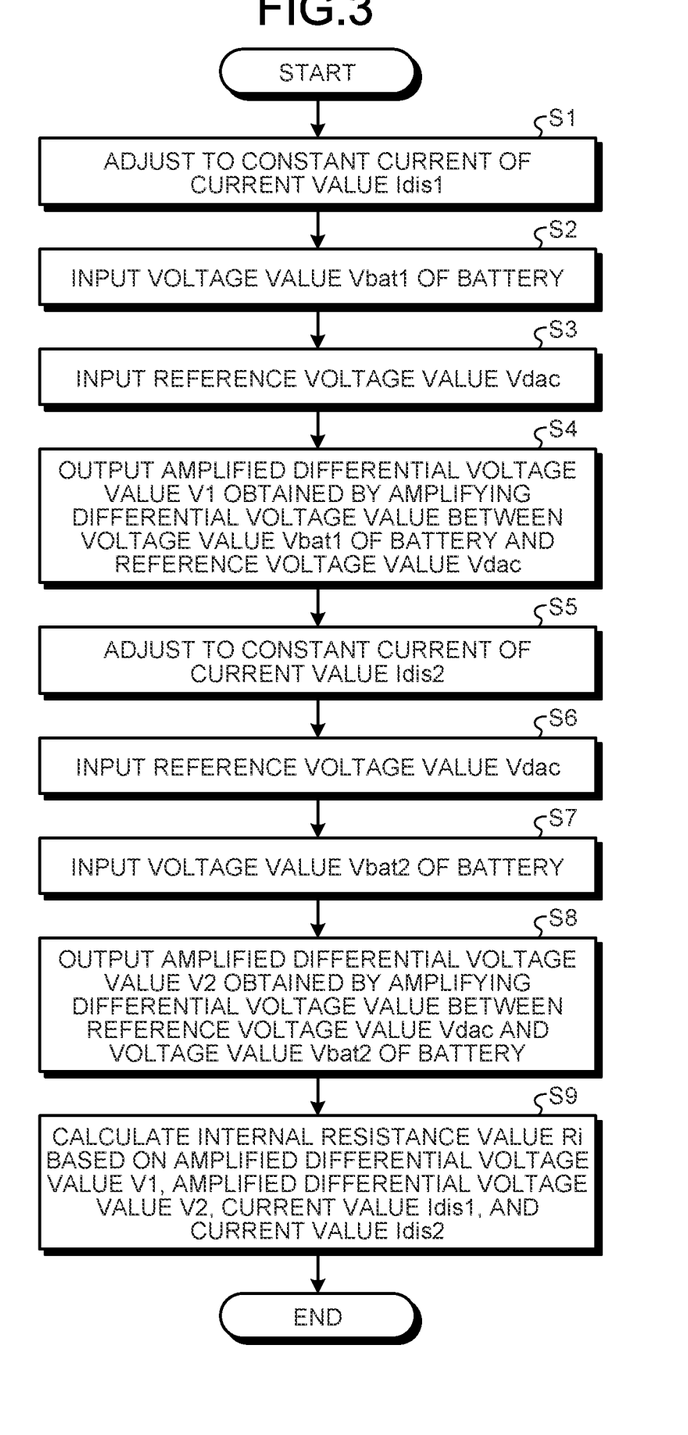
FIG. 3 is a flowchart illustrating an operation example of the battery monitoring device according to the embodiment.

An operation example of the battery monitoring device 1 will now be described. FIG. 3 is a flowchart illustrating an operation example of the battery monitoring device 1 according to the embodiment. In order to detect a difference in cell voltage due to a change in the charge/discharge current of the battery BT, the battery monitoring device 1 adjusts the battery monitoring circuit M to the constant current of the current value Idis1 by the constant current circuit 10 (step S1). The control logic unit 42 then turns on the switches SW1A and SW1B, and turns off the switches SW2A and SW2B. The amplifier circuit 30 inputs the voltage value Vbat1 of the battery BT from the input terminal V+ (step S2), and also inputs the reference voltage value Vdac from the input terminal V− (step S3). The amplifier circuit 30 then amplifies the differential voltage value (Vbat1−Vdac) between the voltage value Vbat1 of the battery BT and the reference voltage value Vdac, and outputs the amplified differentia voltage value V1 to the MCU 40 (step S4).

The constant current circuit 10 then adjusts the battery monitoring circuit M to the constant current of the current value Idis2 different from the current value Idis1 (step S5). The control logic unit 42 then turns on the switches SW2A and SW2B, and turns off the switches SW1A and SW1B. The amplifier circuit 30 inputs the reference voltage value Vdac from the input terminal Vd+ (step S6), and also inputs the voltage value Vbat2 of the battery BT from the input terminal V− (step S7). The amplifier circuit 30 then amplifies the differential voltage value (Vdac−Vbat2) between the reference voltage value Vdac and the voltage value Vbat2 of the battery BT, and outputs the amplified differential voltage value V2 to the MCU 40 (step S8).

The MCU 40 then calculates the internal resistance value Ri based on the amplified differential voltage value V1 outputted from the amplifier circuit 30, the amplified differential voltage value V2 outputted from the amplifier circuit 30, the current value Idis1 of a constant current adjusted by the constant current circuit 10, and the current value Idis2 of a constant current adjusted by the constant current circuit 10 (step S9).

As described above, the battery monitoring device 1 according to the embodiment includes the battery monitoring circuit M, the constant current circuit 10, the amplifier circuit 30, and the CPU 44. The battery monitoring circuit M includes the battery BT to be monitored. The constant current circuit 10 is provided in the battery monitoring circuit M and adjusts the current of the battery BT flowing in the battery monitoring circuit M to a constant current of a predetermined current value Idis1 and a constant current of a predetermined current value Idis2 which is a current value different from the current value Idis1. The amplifier circuit 30 outputs an amplified differential voltage value V1 obtained by amplifying the differential voltage value between the voltage value Vbat1 of the battery BT when the constant current of the current value Idis1 adjusted by the constant current circuit 10 flows to the battery monitoring circuit M and a predetermined reference voltage value Vdac. Further, the amplifier circuit 30 outputs an amplified differential voltage value V2 obtained by amplifying the differential voltage value between the voltage value Vbat2 of the battery BT when the constant current of the current value Idis2 adjusted by the constant current circuit 10 flows to the battery monitoring circuit M and the reference voltage value Vdac. The CPU 44 calculates the internal resistance value Ri of the battery BT based on the amplified differential voltage value V1 outputted from the amplifier circuit 30, the amplified differential voltage value V2 outputted from the amplifier circuit 30, the current value Idis1 of a constant current adjusted by the constant current circuit 10, and the current value Idis2 of a constant current adjusted by the constant current circuit 10. The above-described reference voltage value Vdac is a voltage value between the voltage value Vbat1 and the voltage value Vbat2.

In the battery monitoring device 1, the voltage value which can be detected by the MCU 40 is limited, and therefore, the amplified differential voltage values V1 and V2 must be set to be less than or equal to the maximum voltage value (for example, 5 V) which can be detected by the MCU 40. In the conventional battery monitoring device, in order to make the amplified differential voltage value positive, the reference voltage value Vdac is set to a voltage value smaller than the voltage values Vbat1 and Vbat2, and the reference voltage value Vdac is subtracted from the voltage values Vbat1 and Vbat2 to calculate the differential voltage. In the conventional battery monitoring device, in order to make the differential voltage value after amplification less than or equal to the maximum voltage value of the MCU 40, the amplification factor is adjusted to the larger differential voltage value before amplification. Thus, the conventional battery monitoring device cannot increase the amplification factor, so that the detection accuracy of the internal resistance value Ri of the battery BT may be lowered.

On the other hand, in the battery monitoring device 1, the reference voltage value Vdac is a voltage between the voltage value Vbat1 and the voltage value Vbat2, and therefore the differential voltage value before amplification between the voltage values Vbat1 and Vbat2 and the reference voltage value Vdac can be made smaller than in the case where the reference voltage value Vdac is smaller than the voltage value Vbat1 and the voltage value Vbat2 as in the conventional device. Thus, the battery monitoring device 1 can increase the amplification factor of the amplifier circuit 30 more than the conventional device and therefore improve the detection accuracy of the internal resistance value Ri of the battery BT more than the conventional device. Therefore, the battery monitoring device 1 can accurately estimate the deterioration of the battery BT based on the internal resistance value Ri. Thus, the battery monitoring device 1 can extend the of the battery BT by controlling the battery BT corresponding to the deterioration of the battery BT.

In the above-described battery monitoring device 1, the reference voltage value Vdac is a central voltage value between the voltage value Vbat1 and the voltage value Vbat2. This configuration allows the battery monitoring device 1 to reduce the differential voltage value before amplification between the voltage values Vbat1 and Vbat2 and the reference voltage value Vdac to about half as compared with the conventional device. Thus, the battery monitoring device 1 can increase the amplification factor of the amplifier circuit 30 to about twice as large as that of the conventional device, and can reduce the error of the internal resistance value Ri to about half that of the conventional device.

In the above-described battery monitoring device 1, the reference voltage value Vdac is a voltage value corresponding to the number of years in use of the battery BT and the temperature change of the battery BT. This configuration allows the battery monitoring device 1 to set the reference voltage value Vdac to a voltage between the voltage value Vbat1 and the voltage value Vbat2 even when the battery BT is in its initial state or when the maximum number or years in use has been reached. Further, the battery monitoring device 1 can set the reference voltage value Vdac to a voltage between the voltage value Vbat1 and the voltage value Vbat2 even when the operating temperature of the battery BT is the lowest or the operating temperature of the battery BT is the highest.

Modification

Figure 4:
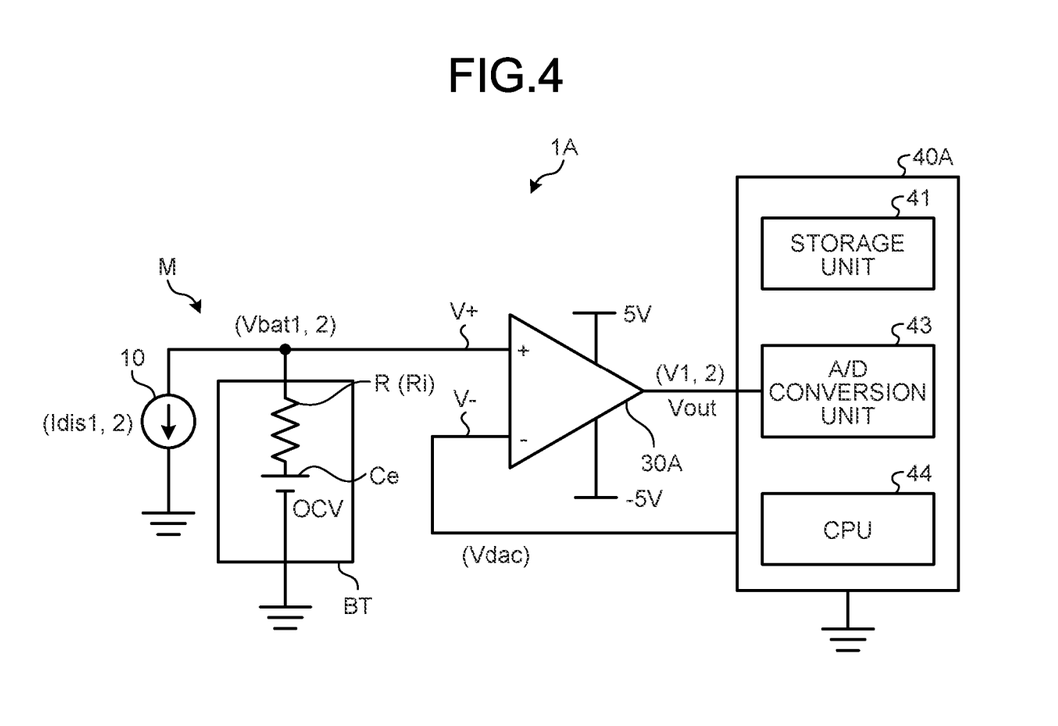
FIG. 4 is a circuit diagram illustrating a configuration example of a battery monitoring device according to a modification of the embodiment.

A modification of the embodiment will now be described. In the modification, the same components as those in the embodiment are denoted by the same reference numerals, and a detailed description thereof will be omitted. FIG. 4 is a circuit diagram illustrating a configuration example of a battery monitoring device 1A according to a modification of the embodiment. The battery monitoring device 1A according to the modification differs from the battery monitoring device 1 according to the embodiment in that an amplifier circuit 30A has both positive and negative power supplies.

As illustrated in FIG. 4, the battery monitoring device 1A according to the modification includes a battery monitoring circuit M, a battery BT, a constant current circuit 10, the amplifier circuit 30A, and an MCU 40A.

The amplifier circuit 30A is a differential amplifier circuit for amplifying a differential voltage and is operated by both positive and negative power supplies (+/−5 V). The amplifier circuit 30A includes an input terminal V+, an input terminal V−, and an output terminal Vout. The input terminal V+ is connected to the positive electrode of the battery BT and inputs voltage values Vbat1 and Vbat2 of the battery BT. The input terminal V− is connected to the MCU 40A, and inputs a reference voltage value Vdac from the MCU 40A. The output terminal Vout is connected to the MCU 40A and outputs the amplified differential voltage to the MCU 40A.

For example, the amplifier circuit 30A amplifies a differential voltage (voltage value Vbat1−reference voltage value Vdac) between the voltage value Vbat1 of the battery BT inputted from the input terminal V+ and the reference voltage value Vdac inputted from the input terminal V−, and outputs the amplified differential voltage value V1 from the output terminal Vout to the MCU 40A. Further, the amplifier circuit 30A amplifies a differential voltage (voltage value Vbat2−reference voltage value Vdac) between the voltage value Vbat2 of the battery BT inputted from the input terminal V+ and the reference voltage value Vdac inputted from the input terminal V−, and outputs the amplified differential voltage value V2 from the output terminal Vout to the MCU 40A.

The MCU 40A calculates the internal resistance value Ri of the battery BT based on the amplified differential voltage values V1 and V2 outputted from the amplifier circuit 30A and the current values Idis1 and Idis2 of the constant current adjusted by the constant current circuit 10. Thus, the battery monitoring device 1A may be configured to use an amplifier circuit 30A having both positive and negative power supplies.

In the above description, although the reference voltage value Vdac has been described with an example in which the reference voltage value Vdac is a central voltage value between the voltage value Vbat1 and the voltage value Vbat2, the reference voltage value Vdac is not limited to the example, and is not limited to the central voltage value if the reference voltage value is a voltage value between the voltage value Vbat1 and the voltage value Vbat2.

Although the reference voltage value Vdac has been described with an example in which the reference voltage value Vdac is a voltage value corresponding to the number of years in use of the battery BT and the temperature change of the battery BT, the reference voltage value Vdac is not limited to the example, and may not be a voltage value corresponding to the number of years in use of the battery BT and the temperature change of the battery BT.

Although the maximum voltage values of the MCUs 40 and 40A have been described with an example of being 5 V, these voltage values are not limited to 5 V and may be other voltage values.

Although the reference voltage value Vdac has been described with an example of being outputted from the MCU 40 to the amplifier circuit 30, the reference voltage value Vdac is not limited to the example, and may be outputted from an external low dropout (LDO) to the amplifier circuit 30, for example.

Although the MCU 40 has been described with an example in which the MCU 40 includes the storage unit 41, the control logic unit 42, the A/D conversion unit 43, and the CPU 44, and these functions are mounted on one IC, the MCU 40 is not limited to the example, and the above-described functions may be distributed to a plurality of ICs.

The battery monitoring device 1 may prepare a plurality of reference voltage values Vdac corresponding to each of the number of years in use of the battery BT and temperature changes of the battery BT, and set appropriate reference voltage values Vdac corresponding to the number of years in use of the battery BT and temperature changes of the battery BT.

Although the CPU 44 has been described with an example of calculating the internal resistance value Ri of the battery BT based on the current values Idis1 and Idis2 of the predetermined constant currents, the CPU 44 is not limited to the example. For example, the CPU 44 may calculate the internal resistance value Ri of the battery BT based on the current values Idis1 and Idis2 of the constant current actually flowing from the battery BT, instead of the current values Idis1 and Idis2 of the predetermined constant currents.

In a battery monitoring device according to the present embodiment, a reference voltage value is a voltage between a first voltage value and a second voltage value of a battery, and an internal resistance value is calculated based on differential voltage value between the reference voltage value and the first and second voltage values, and therefore the differential voltage value before amplification can be reduced. Thus, the battery monitoring device according to the present embodiment can increase the amplification factor and therefore improve the detection accuracy of the internal resistance value of the battery.

Although the invention has been described with respect to specific embodiments for a complete and clear disclosure, the appended claims are not to be thus limited but are to be construed ac embodying all modifications and alternative constructions that may occur to one skilled in the art that fairly fail within the basic teaching herein set forth.

What is claimed is:

1. A battery monitoring device comprising:
   a battery monitoring circuit including a battery to be monitored;
   a constant current circuit that is provided in the battery monitoring circuit and adjusts a current of the battery flowing in the battery monitoring circuit to a constant current of a first current value and a constant current of a second current value which is a current value different from the first current value;
   an amplifier circuit that outputs a first amplified differential voltage value obtained by amplifying a differential voltage value between a first voltage value of the battery and a predetermined reference voltage value when the constant current of the first current value adjusted by the constant current circuit flows in the battery monitoring circuit, and outputs a second amplified differential voltage value obtained by amplifying a differential voltage value between a second voltage value of the battery and the reference voltage value when the constant current of the second current value adjusted by the constant current circuit flows in the battery monitoring circuit; and
   a controller that calculates an internal resistance value of the battery based on the first amplified differential voltage value outputted by the amplifier circuit, the second amplified differential voltage value outputted by the amplifier circuit, the first current value of the constant current adjusted by the constant current circuit, and the second current value of the constant current adjusted by the constant current circuit, wherein the reference voltage value is a voltage value between the first voltage value and the second voltage value.

2. The battery monitoring device according to claim 1, wherein the reference voltage value is a central voltage value between the first voltage value and the second voltage value.

3. The battery monitoring device according to claim 1, wherein the reference voltage value is a voltage value corresponding to the number of years in use of the battery and temperature change of the battery.

4. The battery monitoring device according to claim 2, wherein the reference voltage value is a voltage value corresponding to the number of years in use of the battery and temperature change of the battery.

* * * * *